(12) United States Patent
Grodzki

(10) Patent No.: US 10,042,020 B2
(45) Date of Patent: Aug. 7, 2018

(54) METHOD AND APPARATUS FOR MAGNETIC RESONANCE IMAGING WITH A MUSIC-BASED GRADIENT CURVE

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 416 days.

(21) Appl. No.: 14/932,191

(22) Filed: Nov. 4, 2015

(65) Prior Publication Data
US 2016/0124061 A1    May 5, 2016

(30) Foreign Application Priority Data

Nov. 4, 2014  (DE) .......................... 10 2014 222 496

(51) Int. Cl.
*G01R 33/28*       (2006.01)
*G01R 33/385*      (2006.01)
*G10H 1/045*       (2006.01)

(52) U.S. Cl.
CPC ......... *G01R 33/3854* (2013.01); *G10H 1/045* (2013.01); *G01R 33/288* (2013.01); *G10H 2210/021* (2013.01); *G10H 2210/111* (2013.01); *G10H 2220/371* (2013.01); *G10H 2220/441* (2013.01); *G10H 2230/045* (2013.01)

(58) Field of Classification Search
CPC .............. G01R 33/543; G01R 33/3854; G01R 33/283; G01R 33/34092; G01R 33/385; G01R 33/4828; G01R 33/50; G01R 33/56; G01R 33/56341; H03G 3/32; H03G 5/165; H03G 9/025; G10K 11/175; H04K 2203/12; H04K 3/42; H04K 3/45; H04K 3/825
See application file for complete search history.

(56) References Cited

U.S. PATENT DOCUMENTS 9,634,632 B2 * 4/2017 Mantegna ............. H03G 5/165
2011/0142250 A1 * 6/2011 Schmale ............ G01R 33/288
381/73.1

(Continued)

OTHER PUBLICATIONS

Ma et al., "Using Gradient Waveforms Derived from Music in MR Fingerprinting (MRF) to Increase Patient Comfort in MRI," Proc. Intl. Soc. Mag. Reson. Med., vol. 22, p. 47 (2014).

(Continued)

*Primary Examiner* — Clayton E Laballe
*Assistant Examiner* — Ruifeng Pu
(74) *Attorney, Agent, or Firm* — Schiff Hardin LLP

(57) ABSTRACT

In a method and apparatus for magnetic resonance imaging with a music-based gradient curve, a magnetic resonance sequence and a piece of music are provided to a controller of a magnetic resonance apparatus. The piece of music is modified in the controller by taking into account at least one acoustic resonance parameter that characterizes at least one acoustic resonance frequency of the magnetic resonance apparatus, so a modified piece of music is generated. A gradient curve of the magnetic resonance sequence is adjusted using the modified piece of music, so an adjusted magnetic resonance sequence is generated. Magnetic resonance image data of the examination object is acquired by operation of the apparatus with of the adjusted magnetic resonance sequence.

14 Claims, 3 Drawing Sheets

(56) References Cited

U.S. PATENT DOCUMENTS

| | | | |
|---|---|---|---|
| 2011/0268293 A1* | 11/2011 | Mantegna | H03G 3/32 |
| | | | 381/103 |
| 2012/0235678 A1 | 9/2012 | Seiberlich et al. | |
| 2013/0265047 A1 | 10/2013 | Griswold et al. | |
| 2015/0070012 A1* | 3/2015 | Griswold | G01R 33/283 |
| | | | 324/309 |
| 2015/0123657 A1* | 5/2015 | Rapoport | G01R 33/543 |
| | | | 324/309 |
| 2015/0241536 A1* | 8/2015 | Grodzki | G01R 33/385 |
| | | | 324/309 |
| 2015/0253395 A1* | 9/2015 | Lazar | G01R 33/34092 |
| | | | 324/314 |
| 2015/0276904 A1* | 10/2015 | Grodzki | A61B 5/055 |
| | | | 324/309 |
| 2015/0309148 A1* | 10/2015 | Hardy | G01R 33/4826 |
| | | | 324/309 |
| 2015/0355305 A1* | 12/2015 | Helle | G01R 33/3854 |
| | | | 324/309 |
| 2016/0381468 A1* | 12/2016 | Petrausch | H03G 7/002 |
| | | | 381/320 |

OTHER PUBLICATIONS

Loeffler et al., "Anxiety Loss Offered by Harmonic Acquisition (ALOHA)," Proc. Intl. Soc. Mag. Reson. Med., vol. 10, p. 0293 (2002).

Ma et al., "Magnetic Resonance Fingerprinting," Nature, 495.7440, pp. 187-192 (2013).

* cited by examiner

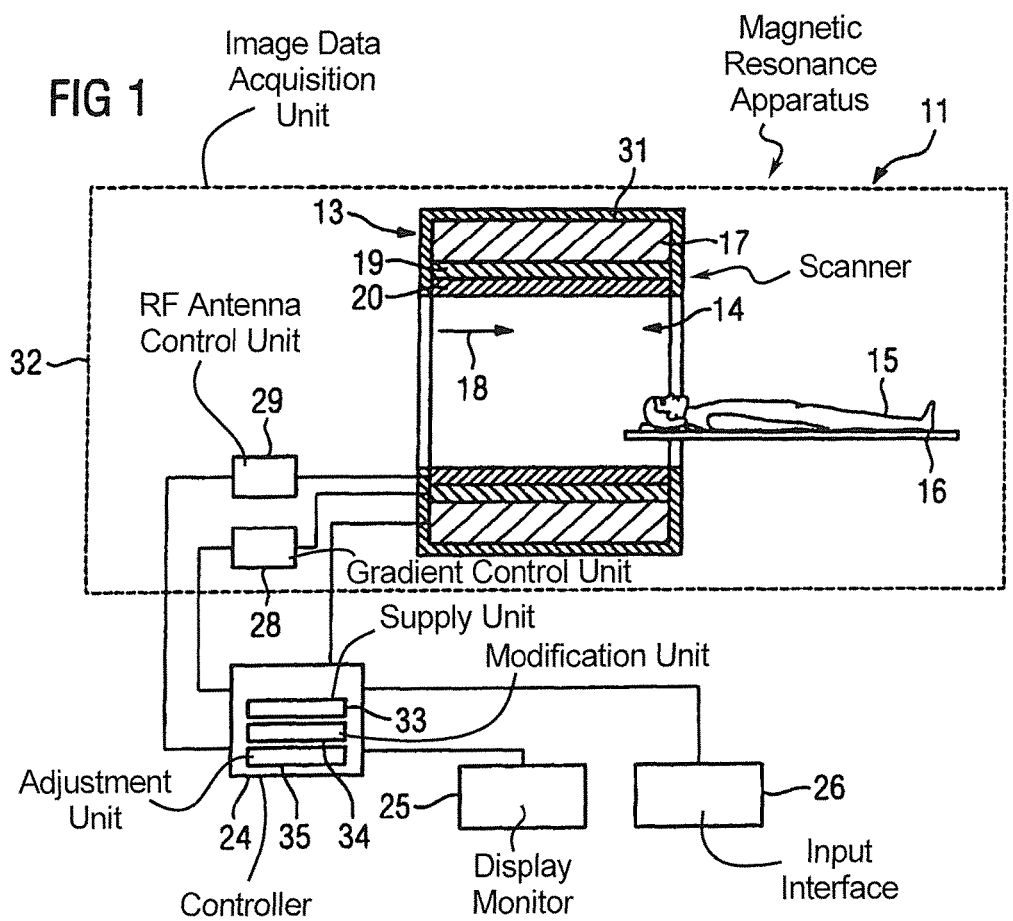
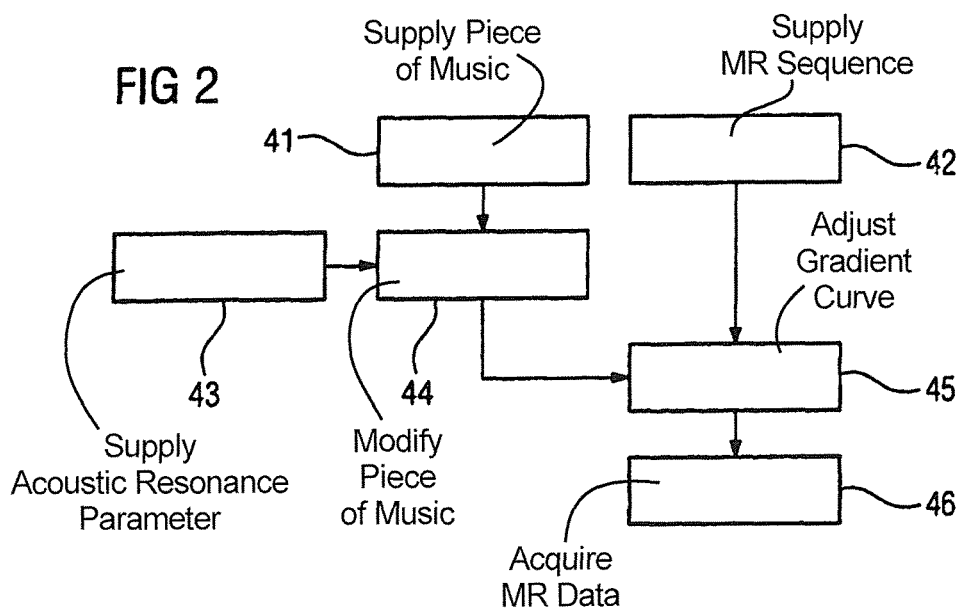

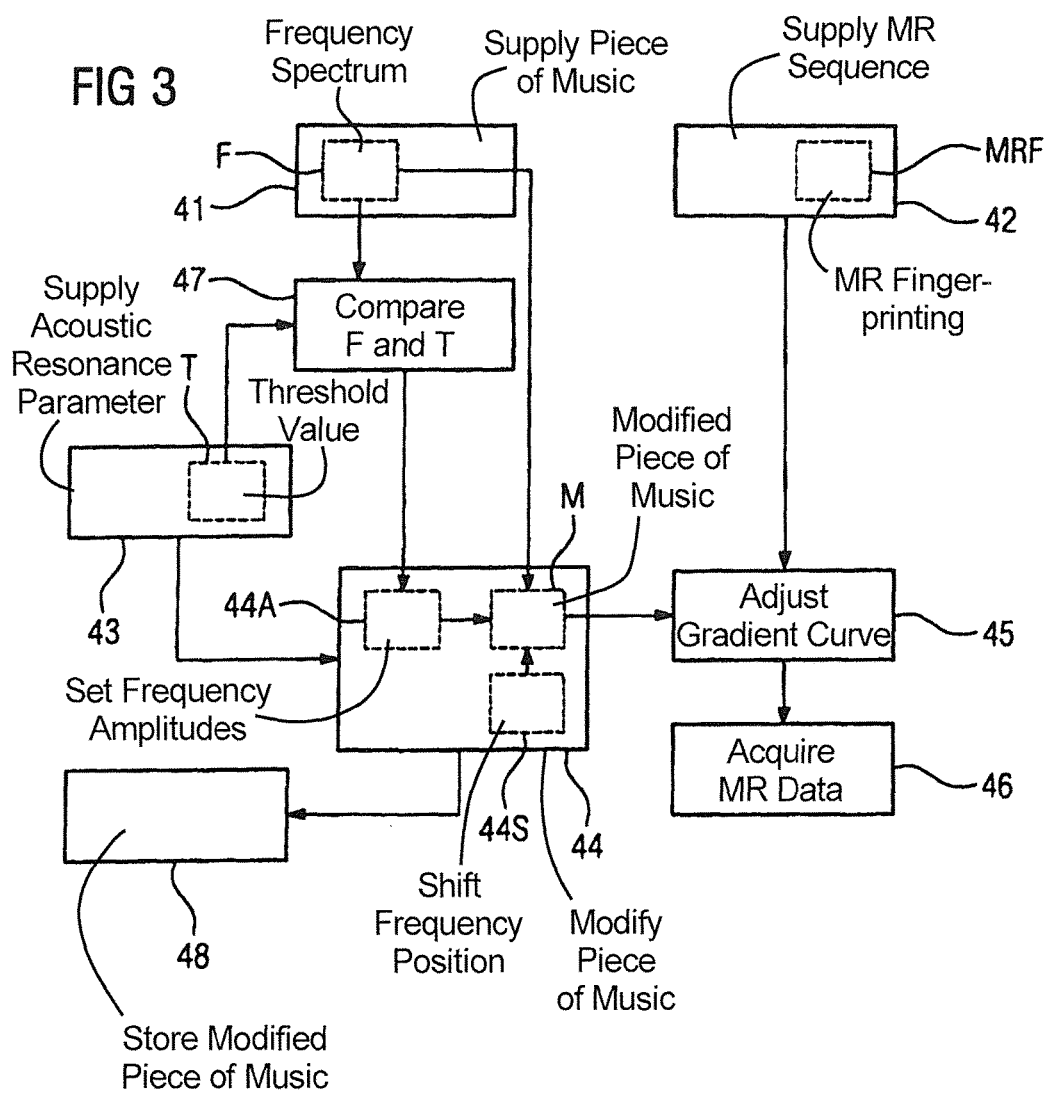

METHOD AND APPARATUS FOR MAGNETIC RESONANCE IMAGING WITH A MUSIC-BASED GRADIENT CURVE

BACKGROUND OF THE INVENTION

Field of the Invention

The invention concerns a method for magnetic resonance imaging with a music-based gradient curve, as well as a magnetic resonance apparatus and to a non-transitory, computer-readable data storage medium encoded with programming instructions for implementing such a method.

Description of the Prior Art

In a magnetic resonance apparatus, also called a magnetic resonance tomography system, the body of an examination person, in particular a patient, to be examined is conventionally exposed to a relatively high basic magnetic field, for example of 1.5 or 3 or 7 tesla, generated by a basic field magnet. In addition, gradient switching operations are employed with the operation of a gradient coil unit. Radio-frequency pulses, for example excitation pulses, are then emitted by a radio-frequency antenna unit by having suitable antennas, and this leads to the nuclear spins of specific atoms being excited in a resonant manner by these radio-frequency pulses, so as to be tilted by a defined flip angle with respect to the magnetic field lines of the basic magnetic field. When the nuclear spins relax, radio-frequency signals, known as magnetic resonance signals, are emitted by the spins, which are received by suitable radio-frequency antennas and then processed further. The desired image data are reconstructed from the raw data acquired in this way.

For a specific measurement (MR data acquisition) a specific magnetic resonance sequence, also called a pulse sequence, is emitted that includes a sequence of radio-frequency pulses, such as excitation pulses and refocusing pulses, and appropriate gradient switching operations that are executed in a coordinated manner along respective gradient axes in respective directions. At an appropriate time coordinated therewith, readout windows are set, which specify the durations in which the induced magnetic resonance signals are detected.

It is known to control a magnetic resonance apparatus (scanner) such that, during acquisition of magnetic resonance image data, gradient switching operations generate a sequence of notes by operation of a gradient coil. This sequence of notes can be perceived as traditional music by an examination object, from whom the magnetic resonance image data are being acquired. Patient comfort during acquisition of the magnetic resonance image data can be increased in this way.

SUMMARY OF THE INVENTION

An object of the invention is to enable a reliable method for magnetic resonance imaging with a music-based gradient curve.

The inventive method for magnetic resonance imaging an examination object by operation of a magnetic resonance scanner includes the following method steps.

A magnetic resonance sequence and a piece of music are provided to a controller (processor) that operates a magnetic resonance scanner.

The piece of music is modified with the controller by taking into account at least one acoustic resonance parameter that characterizes at least one acoustic resonance frequency of the magnetic resonance scanner, so a modified piece of music is generated.

The gradient curve of the magnetic resonance sequence is adjusted using the modified piece of music, so that an adjusted magnetic resonance sequence is generated.

Magnetic resonance raw data are acquired from the examination object by operation of the scanner with the adjusted magnetic resonance sequence.

The examination object can be a patient, a trainee or a phantom. The acquired magnetic resonance raw data are converted into image data, which are then made available, in electronic form, i.e. displayed on a display monitor and/or stored in a database as a data file, for a user.

Providing the magnetic resonance sequence can include a selection and/or actual creation of the magnetic resonance sequence. The selection of a magnetic resonance sequence can be made by a user via an input interface. The magnetic resonance sequence can be also be determined by a selected examination protocol. Providing the magnetic resonance sequence can also include a selection of imaging parameters for the magnetic resonance sequence.

Providing the piece of music can include loading a piece of music from a database. The piece of music can be manually selected by an operator of the magnetic resonance apparatus or the examination subject. The piece of music is present in a suitable data file format, for example in an mp3 format or a way format. The piece of music can also be loaded directly from a portable music player, which may belong to the examination object and is connected to the controller of the magnetic resonance scanner. The piece of music therefore can be advantageously adjusted to the preferences of the examination subject.

The piece of music is preferably modified before adjustment of the gradient curve. However, it is also conceivable for the piece of music to be modified at least partly at the same time as adjustment of the gradient curve. Therefore, while a later part of the piece of music is still being modified, the gradient curve can already be adjusted with the use of an earlier part of the piece of music, which has already been modified. It is also conceivable for the piece of music to still be modified during acquisition of the magnetic resonance image data.

Modifying the piece of music preferably includes modifying frequencies and/or frequency amplitudes of the piece of music, as described in more detail below. Alternatively or additionally, modifying the piece of music can include modifying a rhythm and/or a playback speed of the piece of music. It is also conceivable for the volume of the piece of music to be modified. Modifying the piece of music can also involve removing recurring patterns, for example a bass line, from the piece of music. Of course further modifications of the piece of music that appear expedient to those skilled in the art are also possible.

The at least one acoustic resonance parameter can be stored system-specifically for the magnetic resonance scanner, by which the magnetic resonance image data are to be acquired from the examination object. The at least one acoustic resonance parameter can also be stored generally for a relatively large number of magnetic resonance scanners, for example for one commercial model type of magnetic resonance scanner. The at least one acoustic resonance parameter therefore can ensure that the piece of music is adjusted to a specific magnetic resonance scanner or to a specific type of magnetic resonance scanner. It is also conceivable for an acoustic resonance parameter to be stored for different magnetic resonance scanners. In order to facilitate modification of the piece of music by taking into account the acoustic resonance parameter, the acoustic resonance parameter is loaded from one database, which may be a system-specific database.

The at least one acoustic resonance frequency can be specific to the specific magnetic resonance scanner with which the magnetic resonance image data of the examination object are acquired. The at least one acoustic resonance frequency can also be specific to a number of magnetic resonance scanners, for example one model of magnetic resonance scanner or a family of magnetic resonance scanners from a specific manufacturer. The at least one acoustic resonance frequency can be produced by the hardware design of the magnetic resonance scanner, for example the scanner housing (shell), gradient coil unit, the basic field magnet, or radio-frequency antenna unit of the magnetic resonance scanner. The at least one acoustic resonance frequency can be a vibration frequency to which mechanical components of the magnetic resonance device can be excited to form mechanical vibrations (oscillations). If soundwaves with the at least one acoustic resonance frequency occur on the magnetic resonance scanner, the soundwaves can cause at least parts of the magnetic resonance device to vibrate. The at least one acoustic resonance frequency can therefore be a mechanical inherent (natural) vibration frequency of the magnetic resonance scanner.

The at least one acoustic resonance frequency can be in a frequency range that is audible to humans. The at least one acoustic resonance frequency can be characterized by specifying at least one frequency band, which extends over a frequency range. The at least one acoustic resonance frequency can be within the at least one frequency band. In addition to the acoustic resonance frequency, the at least one frequency band therefore can include further frequencies that lie around the acoustic resonance frequency. The at least one frequency band therefore can include a safety margin around the at least one acoustic resonance frequency. It is also possible for the at least one frequency band to encompass multiple acoustic resonance frequencies of the magnetic resonance scanner. For example, a frequency band of the acoustic resonance frequency can lie in a frequency range of 400-2000 Hertz, typically in a frequency range of 600-1500 Hertz, in particular in a frequency range of 800-1000 Hertz.

The at least one acoustic resonance parameter can directly characterize the at least one acoustic resonance frequency of the magnetic resonance scanner. The at least one acoustic resonance parameter therefore can directly specify at which frequency an acoustic resonance frequency of the magnetic resonance device lies. The at least one acoustic resonance parameter can also indirectly determine the at least one acoustic resonance frequency, since the at least one acoustic resonance parameter defines a frequency band around the acoustic resonance frequency. The at least one acoustic resonance parameter can—as described below—also determine a frequency amplitude threshold value for amplitudes of frequency components which lie in a frequency band of an acoustic resonance frequency of the magnetic resonance device. The at least one acoustic resonance parameter can also specify, for example, system properties of the magnetic resonance scanner from which the at least one acoustic resonance frequency can be derived.

The piece of music is advantageously modified such that the at least one acoustic resonance frequency in the modified piece of music is excited less than in the non-modified piece of music. For example, frequency amplitudes, which lie in a range of the at least one acoustic resonance frequency, can be largely suppressed in the modified piece of music and/or lie below a frequency amplitude threshold value. For this purpose the at least one acoustic resonance parameter can be included as an input parameter in an algorithm that is executed to modify the piece of music. The algorithm can then modify the piece of music such that the at least one acoustic resonance frequency in the modified piece of music occurs less frequently than in the non-modified piece of music. The at least one acoustic resonance parameter can determine a boundary condition for the modification of the piece of music. The piece of music can be analyzed with respect to the at least one acoustic resonance parameter before the modification. If the result of this analysis is that the piece of music meets the requirements, which are imposed inter alia by the at least one acoustic resonance parameter, the piece of music can also be used without modification for adjustment of the gradient curve.

The modified piece of music is used, as described below, as the basis for adjusting the gradient curve. The modified piece of music can be used as an input parameter for an algorithm, by which the gradient curve is adjusted. To adjust the gradient curve the modified piece of music is advantageously in a frequency domain. The modified piece of music can be filtered. A change in sampling, a resampling, of the modified piece of music can also be implemented, so the modified piece of music is adjusted to a sampling frequency of the gradient curve. Frequencies of the modified piece of music can then be distributed among different gradient axes, for example a slice selection gradient axis, a phase encoding gradient axis or a frequency encoding gradient axis. Overall, an optimization of the gradient curve using the modified piece of music as a boundary condition can be implemented in the adjustment of the gradient curve.

The gradient curve can be adjusted such that, during playback of the adjusted magnetic resonance sequence by means of the adjusted gradient curve, the modified piece of music is played back (performed) by the magnetic resonance scanner. The playback of the modified piece of music by the magnetic resonance scanner can be implemented such that gradient switching operations, based on the adjusted gradient curve, which are executed by the gradient coil unit of the magnetic resonance scanner, generate a sequence of notes that corresponds to the modified piece of music. There can thus be a correspondence between the frequencies of the modified piece of music and the audible frequencies that result during playback of the adjusted gradient curve in the magnetic resonance scanner.

One possibility for adjusting the gradient curve of the magnetic resonance sequence using a piece of music is known, for example, from the document by Ma et al. "Using Gradient Waveforms Derived from Music in MR Fingerprinting (MRF) to Increase Patient Comfort in MRI", Joint Annual Meeting ISMRM-ESMRMB 2014, 10-16 May 2014, Milan Italy. The magnetic resonance sequence described therein is a magnetic resonance fingerprinting recording method. The inventive procedure is, however, not limited to magnetic resonance fingerprinting. Theoretically, gradient curves of any magnetic resonance sequences can be adjusted with the inventive procedure.

The inventive procedure is based on the concept that a typical piece of music has a large number of different frequencies. During playback of the piece of music in the magnetic resonance scanner, a large number of frequencies thus can be excited through the application of gradient switching operations by the gradient coil unit of the magnetic resonance scanner. This may also include acoustic resonance frequencies of the magnetic resonance scanner. An excitation of these acoustic resonance frequencies of the magnetic resonance device is typically undesirable since these can have various adverse effects as a consequence. For example, an excitation of the acoustic resonance frequencies of the magnetic resonance device can lead to an increase in a volume of the magnetic resonance scanner and therefore to reduced patient comfort. It is also conceivable for an excitation of the acoustic resonance frequencies of the magnetic resonance scanner to lead to increased heating of the magnetic resonance scanner. This can in turn lead to increased helium evaporation i a superconducting basic field magnet is used, and/or drifting of the basic magnetic field of the magnetic resonance scanner or drifting of gradient fields.

The piece of music can be modified with respect to the acoustic resonance frequencies such that the acoustic resonance frequencies occur less frequently in the modified piece of music than in the non-modified modified piece of music. By means of the modification of the piece of music for adjusting the gradient curve, the acoustic resonance frequencies of the magnetic resonance device can be excited as little as possible during playback of the modified piece of music by the magnetic resonance scanner.

In this way, impairment of the acquisition of the magnetic resonance image data can be largely avoided. A high image quality of the magnetic resonance image data, which is not impaired by the playback of the modified piece of music by the magnetic resonance scanner, can also be ensured. Artifacts in the acquired magnetic resonance image data can be advantageously avoided. Patient comfort and/or patient safety can also be increased. A further important aspect is that damage to the magnetic resonance scanner during playback of the modified piece of music can be avoided by a suitable modification of the piece of music for adjusting the gradient curve. Reliability of the magnetic resonance scanner can be increased in this way.

In an embodiment, the gradient curve is adjusted using the modified piece of music by generating with the application of gradient switching operations by the gradient coil unit of the magnetic resonance scanner, a sequence of audible notes during acquisition of the magnetic resonance image data, and these sounds correspond to the modified piece of music. Correspondence of the sequence of notes to the modified piece of music means that the sequence of notes and the modified piece of music have similar frequency curves and/or frequency amplitudes. The gradient switching operations are based on the adjusted gradient curve. Switching the currents determined by the gradient switching operations by the coils of the gradient coil unit leads to vibrations in the gradient coil unit, which generate the sequence of notes. In this way acquisition of the magnetic resonance image data for the examination object can be devised so as to be particularly pleasant for the patient, since the magnetic resonance device does not generate non-musical noise during acquisition of the magnetic resonance image data, and instead generates the sequence of notes that is based on the modified piece of music.

In another embodiment, supplying the piece of music is implemented by supplying a frequency spectrum of the piece of music, and modifying the piece of music is implemented by modifying the frequency spectrum of the piece of music, so a modified frequency spectrum is generated. Adjusting the gradient curve is then implemented adjusting the gradient curve using the modified frequency spectrum. The frequency spectrum of the piece of music is designed as a function dependent on the frequency. The frequency spectrum of the piece of music indicates from which of the signal components, dependent on the frequency, the piece of music is composed. The frequency spectrum has frequency amplitudes that represent a weighting of individual frequencies and/or frequency bands of the piece of music in the frequency spectrum. If a radio-frequency amplitude of the individual frequency and/or of the frequency band exists in the frequency spectrum, this typically means that the corresponding frequency component of the piece of music occurs particularly often and thus has a high weighting. It is advantageous to modify the piece of music in its frequency spectrum because the at least one acoustic resonance parameter and/or the acoustic resonance frequencies of the magnetic resonance device can be directly taken into account in this manner. Various approaches are described in the paragraphs below as to how the frequency spectrum of the piece of music can be modified. The approaches can be used individually or combined. The gradient curve can also be adjusted particularly easily on the basis of the modified frequency spectrum.

In an embodiment, frequency amplitudes of at least one frequency band of the frequency spectrum are compared with at least one predefined frequency amplitude threshold value and the frequency spectrum is modified using a result of the comparison. The at least one frequency band constitutes a frequency span (frequency range) of the piece of music. The at least one frequency band can be a critical frequency range of the magnetic resonance device in which an acoustic resonance frequency of the magnetic resonance device can lie. The at least one frequency band can result from the at least one acoustic resonance parameter. In particular, the at least one frequency band can include the at least one acoustic resonance frequency of the magnetic resonance device. The at least one frequency band can also be limited to a single frequency value, an acoustic resonance frequency. The at least one frequency amplitude threshold value can determine a maximum amplitude for individual frequencies within the at least one frequency band. The maximum amplitude must not be exceeded by a frequency of the at least one frequency band. The at least one frequency amplitude threshold value can result from the at least one acoustic resonance parameter. The at least one frequency amplitude threshold value may be configured such that absolutely no frequency components are allowed to be in the relevant frequency band. The comparison of the frequency amplitudes can be made before modification of the frequency spectrum. It is also conceivable for the comparison of the frequency amplitudes to be made at least partly during the modification of the frequency spectrum, or to constitute a sub-step of modification of the frequency spectrum. The frequency spectrum is modified in the at least one frequency band, if there is a frequency amplitude in the at least one frequency band that is higher than the at least one predefined frequency amplitude threshold value. Different frequency amplitude threshold values can be predefined for different frequency bands. Using the frequency amplitude threshold value can ensure particularly easy and reliable modification of the piece of music, which is suitably matched to the excitation frequencies of the magnetic resonance scanner.

In another embodiment, the at least one frequency band includes the at least one acoustic resonance frequency of the magnetic resonance device. In this way the at least one frequency band can be determined particularly advantageously using the at least one acoustic resonance parameter that characterizes the at least one acoustic resonance frequency.

In another embodiment, modifying the frequency spectrum is implemented by setting frequency amplitudes of the at least one frequency band, which are higher than the at least one predefined frequency amplitude threshold value, at the at least one frequency amplitude threshold value. The frequency amplitudes in the at least one frequency band thus can be tailored to the at least one frequency amplitude threshold value. If no frequency amplitudes occur that are higher than the at least one predefined frequency amplitude threshold value, the at least one frequency band can be left unchanged in the modification of the frequency spectrum. The frequency amplitudes of the at least one frequency band of the modified frequency spectrum are advantageously limited in terms of their level to the at least one frequency amplitude threshold value. Overall, this procedure can reliably ensure that no undesirable frequencies that are stronger than permitted are excited in the at least one frequency band during playback of the piece of music by the magnetic resonance scanner.

In another embodiment, modifying the frequency spectrum is implemented by shifting a frequency position of the frequency spectrum by a shift frequency. The frequency position of the entire piece of music can be shifted in this way. It is also conceivable for only part of the frequency spectrum of the piece of music to be shifted in its frequency position. The piece of music can be played back at a higher or lower frequency position. The shift frequency can be, for example, a half-note step or a whole-note step. Further shift frequencies that appear expedient to those skilled in the art are also conceivable. If the examination subject does not have absolute pitch, it is not typically possible for the examination object to notice such a shift in the frequency position. The piece of music thus can be played back by the magnetic resonance scanner during acquisition of the magnetic resonance raw data with unchanged sound characteristics for most examination objects. At the same time the shift in the frequency position means that frequencies in undesirable frequency bands of the magnetic resonance device can be prevented from being excited during the playback of the modified piece of music by magnetic resonance device. The procedure described in the following paragraph can be used, for example, to determine a suitable shift frequency.

In this embodiment, the shift frequency is chosen under at least one boundary condition. The at least one boundary condition can be that frequency amplitudes, which are present in at least one frequency band of the modified frequency spectrum, are reduced. As described in the preceding paragraphs, the at least one frequency band can include the at least one acoustic resonance frequency of the magnetic resonance scanner. The at least one frequency band thus can be determined by the acoustic resonance parameter. The shift frequency thus can be chosen such that high frequency amplitudes of the at least one frequency band are shifted into a lower or higher uncritical frequency band. Reducing the frequency amplitudes can include, for example, the frequency amplitudes being chosen so as to be as low as possible and/or minimized. The frequency amplitudes in the at least one frequency band can be reduced such that they are limited to the at least one frequency amplitude threshold value of the at least one frequency band. In this way the piece of music can be modified while retaining the sound characteristics of the piece of music suitable for adjusting the gradient switching operations.

In another embodiment, the shift frequency is changed over a period of acquisition of the magnetic resonance raw data. This procedure is advantageous if a shift in the frequency of the piece of music as a whole is not possible, in particular if the at least one frequency amplitude threshold value in the at least one frequency band cannot be maintained in this way. The frequency amplitudes in the critical frequency bands can be minimized by the change in the shift frequency over time. Sound characteristics of the modified piece of music can be largely retained if the shift frequency is varied slowly over time.

In another embodiment, a frequency position in at least one frequency band of the frequency spectrum is shifted by a shift frequency, and the shift frequency is chosen such that frequency doubling or frequency halving of the frequencies in the frequency band occurs. The frequencies of the piece of music thus can be shifted by an octave. In this way sound characteristics of the piece of music can be retained during modification of the piece of music.

In another embodiment, the modified piece of music is stored in a database for subsequent further use. If the same piece of music should be played again in a further measurement, the modified piece of music can be loaded from the database and used directly for adjusting the gradient curve. In this way, complexity of repeated modification of the piece of music can be dispensed with.

In another embodiment, the magnetic resonance sequence is a magnetic resonance fingerprinting method. One possible magnetic resonance fingerprinting method is known, for example, from the document Ma et al., "Magnetic Resonance Fingerprinting", Nature, 495, 187-192 (14 Mar. 2013). The magnetic resonance sequence can include multiple repetition intervals, with raw data for a magnetic resonance image being recorded respectively during each repetition interval. Recording parameters can be varied in a pseudorandomized manner during acquisition of the multiple magnetic resonance images. A magnetic resonance signal characteristic can be generated from the magnetic resonance images recorded in this way. The magnetic resonance signal characteristic indicates a change in recorded magnetic resonance signal values over the period of acquisition of the magnetic resonance signal characteristic. A signal comparison of the generated magnetic resonance signal characteristic with a number of database signal characteristics stored in a database can then be made. One different database value of at least one material parameter, for example a T1 relaxation time and/or a T2 relaxation time, is respectively allocated to the various database signal characteristics. The database signal characteristic is then the signal characteristic that is to be anticipated in each case with the magnetic resonance fingerprinting method if a specimen is being examined whose material properties match those of the associated database value of the at least one material parameter. The magnetic resonance fingerprinting method then typically results in a database signal characteristic of the plurality of database signal characteristics, being allocated to the generated magnetic resonance signal characteristic using the result of the signal comparison. The database value of the at least one material parameter, belonging to the allocated database signal characteristic, can then be set as the measured value of the at least one material parameter. The magnetic resonance fingerprinting method enables particularly advantageous adjustment of the gradient curve using the modified piece of music here. The gradient curve can be overlaid with any waveforms, for example the modified frequency spectrum of the modified piece of music, especially since the magnetic resonance sequence can use changeable and/or pseudorandomized repetition times.

The inventive magnetic resonance apparatus has a raw data acquisition unit (scanner), an arithmetic unit with a supply unit, a modification unit and an adjustment unit, wherein the magnetic resonance apparatus are designed to carry out the inventive method.

The inventive magnetic resonance apparatus is therefore designed to carry out a method for magnetic resonance imaging of an examination object. The supply unit is designed to supply a magnetic resonance sequence and a piece of music. The modification unit is designed to modify the piece of music by taking into account at least one acoustic resonance parameter, which characterizes at least one acoustic resonance frequency of the magnetic resonance device, wherein a modified piece of music is generated. The adjustment unit is designed to adjust a gradient curve of the magnetic resonance sequence using the modified piece of music, wherein an adjusted magnetic resonance sequence is generated. The image data acquisition unit is designed to acquire magnetic resonance image data of the examination object by means of the adjusted magnetic resonance sequence.

According to an embodiment of the magnetic resonance apparatus, the adjustment unit and the image data acquisition unit are designed so that the gradient curve is adjusted using the modified piece of music such that, due to the application of gradient switching operations by a gradient coil unit of the magnetic resonance scanner, the magnetic resonance scanner generates a sequence of notes during acquisition of the magnetic resonance raw data, and these notes correspond to the modified piece of music.

In another embodiment of the magnetic resonance apparatus, the supply unit, modification unit and adjustment unit are designed such that providing the piece of music is implemented by providing a frequency spectrum of the piece of music, modifying the piece of music is implemented by modifying the frequency spectrum of the piece of music, so a modified frequency spectrum is generated, and adjusting the gradient curve is implemented by adjusting the gradient curve using the modified frequency spectrum.

In another embodiment of the magnetic resonance apparatus, the controller thereof includes a comparator, and the comparator and the modification unit are designed such that frequency amplitudes of at least one frequency band of the frequency spectrum are compared with at least one predefined frequency amplitude threshold value is made, and the frequency spectrum is modified using a result of the comparison.

In another embodiment of the magnetic resonance apparatus, the comparator and the modification unit are designed such that the at least one frequency band includes the at least one acoustic resonance frequency of the magnetic resonance scanner.

In another embodiment of the magnetic resonance apparatus, the comparator and the modification unit are designed such that modifying the frequency spectrum is implemented by setting frequency amplitudes of the at least one frequency band, which are higher than the at least one predefined frequency amplitude threshold value, at the at least one frequency amplitude threshold value.

In another embodiment of the magnetic resonance apparatus, the modification unit is designed such that modifying the frequency spectrum is implemented by shifting a frequency position of the frequency spectrum by a shift frequency.

In another embodiment of the magnetic resonance apparatus, the modification unit is designed such that the shift frequency is chosen under at least one boundary condition. The at least one boundary condition can be that frequency amplitudes, which are present in at least one frequency band of the modified frequency spectrum, are minimized.

In another embodiment of the magnetic resonance apparatus, the modification unit is designed such that the shift frequency is changed over a period of acquisition of the magnetic resonance raw data.

In another embodiment of the magnetic resonance apparatus, the modification unit is designed such that a frequency position is shifted in at least one frequency band of the frequency spectrum by a shift frequency, wherein the shift frequency is chosen such that frequency doubling or frequency halving of the frequencies of the frequency band occurs.

In another embodiment of the magnetic resonance apparatus, has a memory in which the modified piece of music is stored in a database for subsequent further use.

In another embodiment of the magnetic resonance apparatus, the image data acquisition unit (scanned) is operated such that the magnetic resonance sequence is a magnetic resonance fingerprinting recording method.

The invention also encompasses a non-transitory, computer-readable data storage medium that can be loaded directly into a memory of a programmable processor of a magnetic resonance apparatus. The storage medium is encoded with a program code to carry out the inventive method when the program code is executed in the processor of the magnetic resonance apparatus. As a result, the inventive method can be carried out quickly, robustly and in a manner that can be repeated in an identical manner. The processor must have peripherals such as an appropriate main memory, an appropriate graphics card or an appropriate logic unit, so the respective method steps can be carried out efficiently.

The advantages of the inventive magnetic resonance apparatus and of the inventive storage medium substantially correspond to the advantages of the inventive method, which have been described above in detail. Features, advantages or alternative embodiments mentioned in this connection are similarly applicable to the other aspects of the invention. The corresponding functional features of the method are formed by appropriate modules, in particular by hardware modules.

BRIEF DESCRIPTION OF THE DRAWINGS

FIG. 1 schematically illustrates an inventive magnetic resonance apparatus.

FIG. 2 is a flowchart of a first embodiment of the inventive method.

FIG. 3 is shows a flowchart of a second embodiment of an inventive method.

DESCRIPTION OF THE PREFERRED EMBODIMENTS

Figure 4:
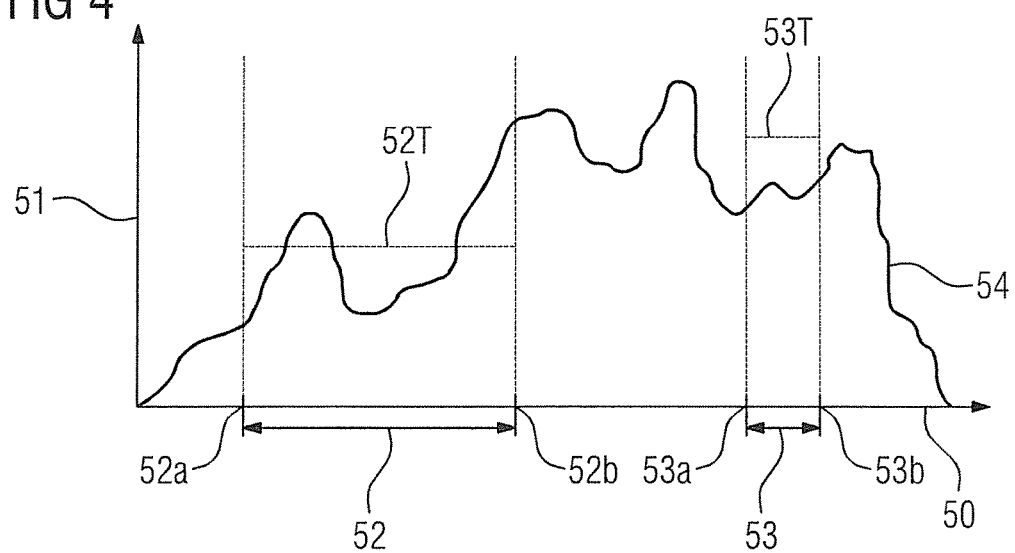
FIG. 4 shows an exemplary frequency spectrum of a non-modified piece of music.

FIG. 1 schematically shows an inventive magnetic resonance apparatus 11. The magnetic resonance apparatus 11 has a scanner 13, having a basic field magnet 17 for generating a strong and constant basic magnetic field 18. The magnetic resonance scanner 13 has a cylindrical patient-receiving region 14 for receiving an examination object 15, in the present case a patient, with the patient-receiving region 14 being cylindrically surrounded in a circumferential direction by the scanner 13. The patient 15 can be moved by a patient-positioning device 16 of the magnetic resonance apparatus 11 into the patient-receiving region 14. The patient-positioning device 16 has for this purpose an examination table arranged so as to move inside the magnetic resonance scanner 13. The scanner 13 is shielded from the outside by a housing shell 31.

The scanner 13 also has a gradient coil unit 19 for generating magnetic field gradients that are used for spatial encoding during imaging. The gradient coil unit 19 is controlled by a gradient control unit 28. The scanner 13 also has a radio-frequency antenna unit 20, which in the illustrated case is designed as a body coil permanently integrated in the magnetic resonance scanner 13, and a radio-frequency antenna control unit 29 for exciting nuclear spins so as to deviate from a polarization that is established in the basic magnetic field 18 generated by the basic field magnet 17. The radio-frequency antenna unit 20 is controlled by a radio-frequency antenna control unit 29 and radiates radio-frequency magnetic resonance sequences into an examination volume formed substantially by the patient-receiving region 14. The radio-frequency antenna unit 20 is also designed to receive magnetic resonance signals, in particular from the patient 15.

For controlling the basic field magnet 17, the gradient control unit 28 and the radio-frequency antenna control unit 29, the magnetic resonance apparatus 11 has a computerized controller 24. The controller 24 centrally controls the magnetic resonance apparatus 11, in particular the scanner 13, such as to execute a predetermined imaging gradient echo sequence. Control information such as imaging parameters, and reconstructed magnetic resonance images, can be supplied on an output unit, in the present case a display monitor 25, of the magnetic resonance apparatus 11 for a user. In addition, the magnetic resonance apparatus 11 has an input interface 26, by which information and/or parameters can be entered by a user during a measuring process. The controller 24 can include the gradient control unit 28 and/or radio-frequency antenna control unit 29 and/or the display monitor 25 and/or the input interface 26.

In the illustrated case the controller 24 has a supply unit 33, modification unit 34 and an adjustment unit 35. The magnetic resonance apparatus 11 also comprises an image data acquisition unit 32. In the present case the image data acquisition unit 32 is formed by the scanner 13 together with the radio-frequency antenna control unit 29 and the gradient control unit 28. The magnetic resonance apparatus 11, with the image data acquisition unit 32 and controller 24, is therefore configured to carry out the inventive method according to FIG. 2 or FIG. 3.

The illustrated magnetic resonance apparatus 11 can have further components that magnetic resonance apparatuses conventionally have. The general operation of a magnetic resonance apparatus is known to those skilled in the art, so a detailed description of the further components is not necessary herein.

FIG. 2 shows a flowchart of a first embodiment of an inventive method for magnetic resonance imaging an examination object 15 by operation of the magnetic resonance apparatus 11.

In a first method step 41, a piece of music is supplied by the supply unit 33 of the controller 24 of the magnetic resonance apparatus 11. In a further method step 42, a magnetic resonance sequence is supplied by the supply unit 33. In a further method step 43, an acoustic resonance parameter is supplied, which characterizes at least one acoustic resonance frequency of the magnetic resonance apparatus 11, in particular the scanner 13 thereof, by the supply unit 33. The piece of music, magnetic resonance sequence and the acoustic resonance parameter can be supplied in any order. The piece of music, magnetic resonance sequence and acoustic resonance parameter are transferred to the modification unit 34 and/or adjustment unit 35 of the controller 24 of the magnetic resonance apparatus 11 for further processing.

In a further method step 44, the piece of music is modified by means of the modification unit 34 by taking account of the at least one acoustic resonance parameter, with a modified piece of music thus being generated. In a further method step 45, a gradient curve of the magnetic resonance sequence is adjusted by the adjustment unit 35 using the modified piece of music, with an adjusted magnetic resonance sequence thereby being generated.

In a further method step 46, the image data acquisition unit 32 of the magnetic resonance apparatus 11 acquires magnetic resonance image data of the examination object 15 by execution of the adjusted magnetic resonance sequence. The acquired magnetic resonance image data can be supplied, in particular displayed, to a user in a further method step (not shown) or can be stored in a database.

FIG. 3 shows a flowchart of a second embodiment of an inventive method for magnetic resonance imaging an examination object 15 by operation of the magnetic resonance apparatus 11.

The following description is substantially limited to the differences from the exemplary embodiment in FIG. 2, with reference being made in relation to unchanging method steps to the description of the exemplary embodiment in FIG. 2. Method steps that substantially stay the same are basically identified by the same reference characters.

The embodiment of the inventive method shown in FIG. 3 includes method steps 41, 42, 43, 44, 45, 46 of the first embodiment of the inventive method according to FIG. 2. In addition, the embodiment of the inventive method shown in FIG. 3 has additional method steps and substeps. A method sequence alternative to FIG. 3 is also conceivable that has only some of the additional method steps and/or substeps shown in FIG. 2. Of course a method sequence alternative to FIG. 3 can also have additional method steps and/or substeps.

In the illustrated case, providing the piece of music in further method step 41 includes providing a frequency spectrum F of the piece of music. The frequency spectrum F of the piece of music can be loaded directly from a database. Alternatively it is also conceivable for a piece of music loaded from a database to be frequency analyzed, wherein the frequency spectrum F of the piece of music is generated.

In the illustrated case, providing the at least one resonance parameter in further method step 43 includes specifying at least one frequency amplitude threshold value T. The specification can be made manually. The frequency amplitude threshold value T can also be automatically derived from system parameters of the magnetic resonance apparatus 11.

In a further method step 47, frequency amplitudes of at least one frequency band of the frequency spectrum F are compared with the at least one frequency amplitude threshold value T. The comparison can be made by a comparator of the controller 24 of the magnetic resonance apparatus 11. The at least one frequency band includes the at least one acoustic resonance frequency of the magnetic resonance device.

Using a result of the comparison, the frequency spectrum F is modified in further method step 44, modifying the piece of music, with a modified frequency spectrum M thus being generated.

The frequency spectrum F can be modified in further method step 44 can by a first procedure 44A or a second procedure 44S. The first procedure 44A and the second procedure 44S can be used separately from each other or combined.

In the first procedure 44A modifying the frequency spectrum F comprises setting frequency amplitudes of the at least one frequency band, which are higher than the at least one predefined frequency amplitude threshold value T, at the at least one frequency amplitude threshold value T. In the modified frequency spectrum M the frequency amplitudes of the at least one frequency band are therefore limited to the at least one frequency amplitude threshold value T.

In the second procedure a frequency position of the frequency spectrum F is shifted by a shift frequency to generate the modified frequency spectrum M. The shift frequency can be chosen under at least one boundary condition, wherein the at least one boundary condition comprises that frequency amplitudes, which are present in at least one frequency band of the modified frequency spectrum M, are minimized. Alternatively or additionally, the shift frequency can be changed over a period of acquisition of the magnetic resonance image data. Alternatively or additionally, it is conceivable for a frequency position in at least one frequency band of the frequency spectrum F to be shifted by a shift frequency, wherein the shift frequency is chosen such that frequency doubling or frequency halving of the frequencies of the frequency band occurs to generate the modified frequency spectrum M.

The gradient curve is adjusted in the case shown in FIG. 3 in further method step 45 using the modified frequency spectrum M. The gradient curve is adjusted using the modified piece of music, in particular the modified frequency spectrum M, such that, due to the application of gradient switching operations by a gradient coil unit of the magnetic resonance device, the magnetic resonance device generates a sequence of notes during acquisition of the magnetic resonance image data, and these notes correspond to the modified piece of music.

The modified piece of music can also be stored in a database in a further method step 48 for subsequent further use. The magnetic resonance sequence provided in further method step 42 can be a magnetic resonance fingerprinting method MRF. In this way the gradient curve of the magnetic resonance sequence can be adjusted particularly easily using the modified piece of music.

The method steps of the inventive method shown in FIG. 2-3 are executed by the processor. For this purpose the processor comprises the required software and/or computer programs which are stored in a memory unit of the processor. The software and/or computer programs comprise(s) program means which are configured to carry out the inventive method when the computer program and/or software is run in the processor by means of a processor unit of the processor.

Figure 5:
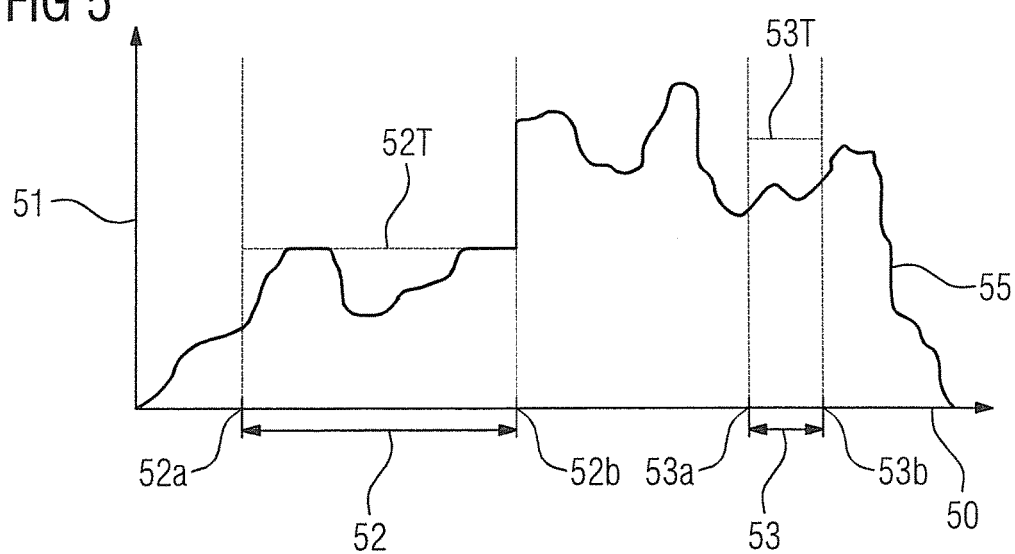
FIG. 5 shows a frequency spectrum according to FIG. 4 after a modification according to an embodiment of the inventive method.

FIG. 4 shows an exemplary frequency spectrum of a non-modified piece of music and FIG. 5 shows a frequency spectrum according to FIG. 4 after a modification according to one embodiment of the inventive method.

The modification of the frequency spectrum shown in FIG. 4-5 should be regarded only as an example and is intended for illustrative purposes. FIGS. 4-5 show only the first procedure 44A, shown in FIG. 3, for modifying the frequency spectrum. Of course further possibilities for how the frequency spectrum shown in FIG. 4 can be modified are conceivable. The illustrated frequency curves 54, 55, frequency bands 52, 53 and frequency amplitude threshold values 52T, 53T should also be regarded only as examples and are randomly chosen.

FIG. 4 shows a non-modified, original frequency curve 54. FIG. 5 on the other hand shows a modified frequency curve 55. The frequency curves 54, 55 are each plotted on a horizontal frequency axis 50. The frequency amplitudes of the frequency curves 54, 55 are each plotted on a vertical amplitude axis 51.

In the illustrated frequency spectra there is a first frequency band 52 and a second frequency band 53, respectively. The frequency bands 52, 53 are those frequency ranges on the frequency axis 50 in which acoustic resonance frequencies of the magnetic resonance apparatus 11 lie. A first lower limit 52a of the first frequency band 52 and a first upper limit 52b of the first frequency band 52 are each marked on the frequency axis 50. A second lower limit 53a of the second frequency band 53 and a second upper limit 53b of the second frequency band 53 are also each marked on the frequency axis 50.

The modification of the frequency spectrum of the piece of music should be carried out in the transition from FIG. 4 to FIG. 5 such that frequency amplitudes of the frequency bands 52, 53, which are higher than predefined frequency amplitude threshold values 52T, 53T, are set at the frequency amplitude threshold values 52T, 53T. For this purpose, the first frequency band 52 has a first frequency amplitude threshold value 52T and the second frequency band 53 a second frequency amplitude threshold value 53T. In the illustrated case the second frequency amplitude threshold value 53T is by way of example higher than first frequency amplitude threshold value 52T. In the second frequency band 53 the frequencies can therefore be excited with higher frequency amplitudes than in the first frequency band 52. In the illustrated case the other frequency ranges, which do not lie in the first frequency band 52 or second frequency band 53, are, for example, not considered in the modification of the frequency spectrum.

If the modified frequency curve 55 in FIG. 5 is considered in comparison to the original frequency curve 54 of FIG. 4, it can be seen that the frequency amplitudes in the first frequency band 52 have been limited to the first frequency amplitude threshold value 52T and in the second frequency band 53 to the second frequency amplitude threshold value 53T. The frequency amplitudes have been cut to the frequency amplitude threshold values 52T, 53T. In this way there is no frequency in the modified frequency spectrum between the first lower limit 52a and the first upper limit 52b which has a frequency amplitude that is higher than the first frequency amplitude threshold value 52T. Between the second lower limit 53a and the second upper limit 53b there is no frequency in the modified frequency spectrum which has a frequency amplitude that is higher than the second frequency amplitude threshold value 53T.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance (MR) raw data, comprising:
providing a processor with an MR data acquisition sequence for operating an MR scanner, said MR scanner comprising a gradient coil system and said MR data acquisition sequence comprising a gradient curve that operates said gradient coil system, said MR scanner having at least one acoustic resonance frequency;

also providing said processor with a piece of music;

in said processor, modifying said piece of music dependent on at least one acoustic resonance parameter that characterizes said at least one acoustic resonance frequency of said MR scanner, thereby producing a modified piece of music;

using said modified piece of music in said processor to adjust said gradient curve in said MR data acquisition sequence, thereby producing an adjusted MR data acquisition sequence; and operating said MR scanner according to said adjusted MR data acquisition sequence, while an examination object is situated in the MR scanner, to acquire MR raw data from the examination object.

2. A method as claimed in claim 1 comprising using said modified piece of music to adjust said gradient curve to cause said gradient coil system to be switched to generate a sequence of musical notes during said acquisition of said MR raw data, said notes corresponding to said modified piece of music.

3. A method as claimed in claim 1 comprising:
providing said piece of music to said processor by providing a frequency spectrum of said piece of music to said processor;
modifying said piece of music by modifying said frequency spectrum, thereby producing a modified frequency spectrum; and
adjusting said gradient curve using said modified frequency spectrum.

4. A method as claimed in claim 3 wherein said frequency spectrum comprises at least one frequency band having frequency amplitudes therein, and comprising modifying said frequency spectrum by comparing said frequency amplitudes in said frequency band of said frequency spectrum with at least one predetermined frequency amplitude threshold value to obtain a comparison result, and modifying said frequency spectrum using said comparison result.

5. A method as claimed in claim 4 wherein said at least one frequency band comprises said at least one acoustic resonance frequency of said MR scanner.

6. A method as claimed in claim 4 comprising modifying said frequency spectrum setting frequency amplitudes of said at least one frequency band, which are designated by said comparison result as being higher than said at least one predetermined frequency amplitude threshold value, to be at said at least one frequency amplitude threshold value.

7. A method as claimed in claim 3 comprising modifying said frequency spectrum by shifting a frequency position of said frequency spectrum by a shift frequency.

8. A method as claimed in claim 1 comprising determining said shift frequency dependent on at least one boundary condition that comprises frequency amplitudes that are present in at least one frequency band of said frequency spectrum, in order to use said frequency amplitudes.

9. A method as claimed in claim 8 comprising changing said shift frequency during acquisition of said MR raw data.

10. A method as claimed in claim 8 comprising shifting a frequency position in said frequency band by said shift frequency, and selecting said shift frequency by frequency doubling or frequency halving of frequencies in said frequency band.

11. A method as claimed in claim 1 comprising storing said modified piece of music in a database in data exchange communication with said processor.

12. A method as claimed in claim 1 comprising providing a sequence for MR fingerprinting to said processor as said MR data acquisition sequence.

13. A magnetic resonance (MR) apparatus comprising:
an MR scanner comprising a gradient coil system, said MR scanner having at least one acoustic resonance frequency;
a processor provided with an MR data acquisition sequence for operating the MR scanner, said MR data acquisition sequence comprising a gradient curve that operates said gradient coil system;
said processor also being provided with a piece of music;
said processor being configured to modify said piece of music dependent on at least one acoustic resonance parameter that characterizes said at least one acoustic resonance frequency of said MR scanner, thereby producing a modified piece of music;
said processor being configured to use said modified piece of music to adjust said gradient curve in said MR data acquisition sequence, thereby producing an adjusted MR data acquisition sequence; and
said processor being configured to operate said MR scanner according to said adjusted MR data acquisition sequence, while an examination object is situated in the MR scanner, to acquire MR raw data from the examination object.

14. A non-transitory, computer-readable data storage medium encoded with programming instructions, said storage medium being loaded into a control and processing computer system of a magnetic resonance (MR) apparatus that comprises an MR scanner having a gradient coil system, and said MR scanner having at least one acoustic resonance frequency, and said programming instructions causing said control and processing computer system to:
receive an MR data acquisition sequence for operating the MR scanner, said MR data acquisition sequence comprising a gradient curve that operates said gradient coil system;
receive a piece of music;
modify said piece of music dependent on at least one acoustic resonance parameter that characterizes said at least one acoustic resonance frequency of said MR scanner, thereby producing a modified piece of music;
use said modified piece of music in said processor to adjust said gradient curve in said MR data acquisition sequence, thereby producing an adjusted MR data acquisition sequence; and
operate said MR scanner according to said adjusted MR data acquisition sequence, while an examination object is situated in the MR scanner, to acquire MR raw data from the examination object.

* * * * *